United States Patent [19]

Akagawa

[11] Patent Number: 4,883,300
[45] Date of Patent: Nov. 28, 1989

[54] END EFFECTOR FOR IC CHIP HANDLING

[75] Inventor: Minoru Akagawa, Fremont, Calif.

[73] Assignee: Intelmatec Corporation, Fremont, Calif.

[21] Appl. No.: 257,324

[22] Filed: Oct. 13, 1988

[51] Int. Cl.$^4$ .............................................. H05K 13/00
[52] U.S. Cl. ................................... 294/2; 29/740; 29/743; 29/762; 269/903; 269/254 R
[58] Field of Search .................. 294/2, 64.1, 119.1; 29/740, 741, 743, 762, 764; 269/903, 254 R

[56] References Cited

U.S. PATENT DOCUMENTS

| | | | |
|---|---|---|---|
| 4,185,814 | 1/1980 | Buchmann et al. | 294/64.1 X |
| 4,591,198 | 5/1986 | Mon forte | 294/119.1 X |
| 4,627,785 | 12/1986 | Mon forte | 294/2 X |
| 4,635,985 | 1/1987 | Rooke | 294/2 |
| 4,729,713 | 3/1988 | Takaichi et al. | 294/2 X |
| 4,733,462 | 3/1988 | Kawatani | 294/64.1 X |
| 4,740,136 | 4/1988 | Asai et al. | 29/740 X |
| 4,753,004 | 6/1988 | Fujioka | 294/2 X |
| 4,767,984 | 8/1988 | Bakker | 269/903 X |
| 4,822,091 | 4/1989 | Vermeer et al. | 29/743 X |

FOREIGN PATENT DOCUMENTS 0154552  9/1985  European Pat. Off. ................ 294/2

*Primary Examiner*—Johnny D. Cherry
*Assistant Examiner*—Joseph D. Pape
*Attorney, Agent, or Firm*—Flehr, Hohbach, Test, Albritton & Herbert

[57] ABSTRACT

An end effector for automatically removing an IC chip from its holder has locating pins to be inserted into holes formed in the holder to properly position itself with respect to the IC chip and shoving pins attached to horizontally movable grippers so as to be able to shove and bend parts of the holder holding the chip to thereby release the chip from the holder. A vertically movable tube connected to a vacuum pump above contacts the chip at the bottom and pulls it out of the holder by suction.

2 Claims, 2 Drawing Sheets

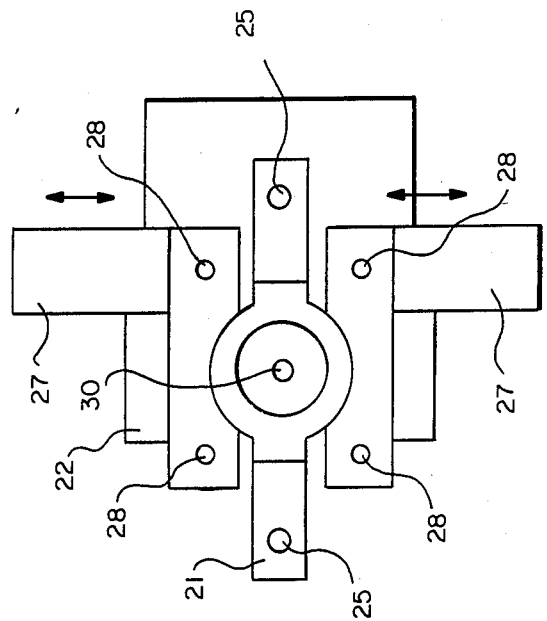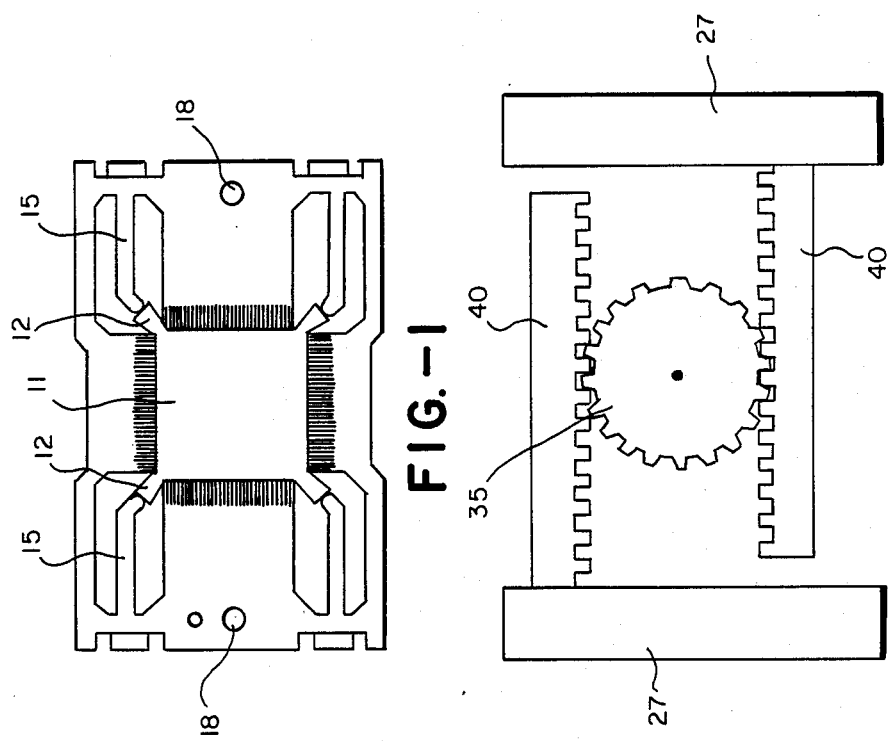

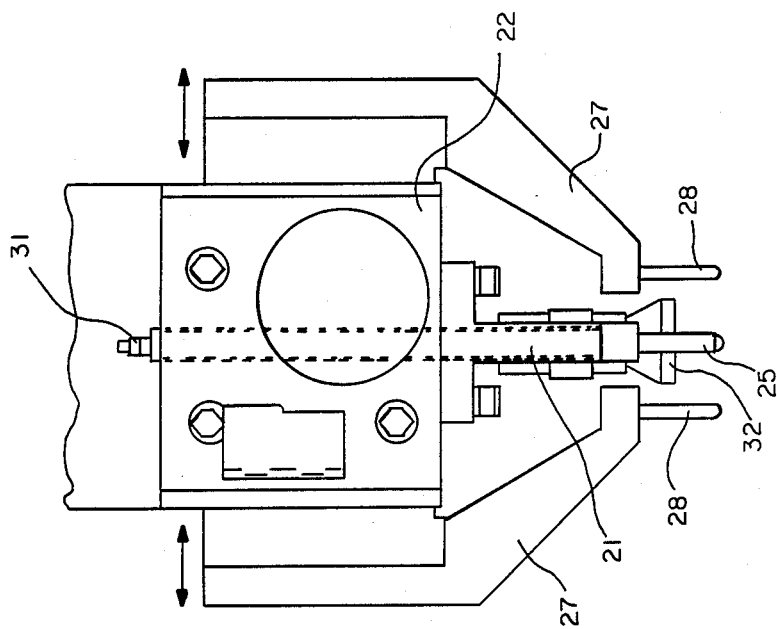
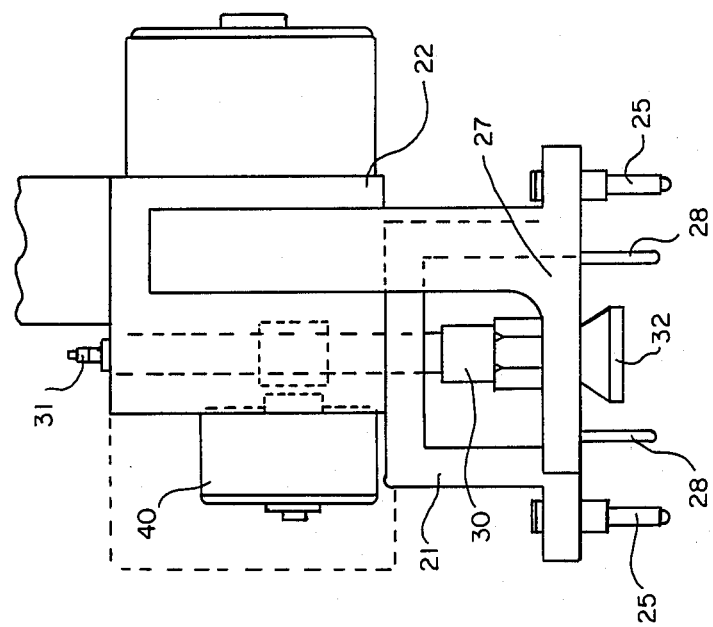

END EFFECTOR FOR IC CHIP HANDLING

BACKGROUND OF THE INVENTION

This invention relates to an end effector for handling IC chips and more particularly to a device which can automatically remove an IC chip from its holder.

IC chips are small and delicate. When they are delivered from where they are manufactured to where they are actually incorporated into a device, for example, holders or the like are typically used to protect the individual chips. An example IC holder to which the present invention relates, is shaped like a frame as shown in FIG. 1 such that a generally squarish chip 11 with diagonal protrusions 12 at each corner is securely supported at the center by four tongue-like holding pieces 15 which protrude inwardly from the frame, each compressingly contacting one of these diagonal protrusions 12 of the chip 11.

In order to manually remove IC chips from their holders thus delivered, an operator must simultaneously press and bend the four tongue-like holding pieces 15 to free the chip 11 and then somehow extricate it from the holder. Both the chips and their holders being small, it is a troublesome job to carry out manually.

SUMMARY OF THE INVENTION

It is therefore an object of the present invention to provide an end effector, or a device for automatically removing an IC from its holder of the type described above and also otherwise handling a removed IC.

The above and other objects of the present invention are achieved by providing a device comprised of means for positioning itself correctly with respect to a holder supporting an IC, means for simultaneously pressing and bending the four tongue-like holding pieces to free the IC, and means for pulling the IC out of its seat by suction.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a plan view of an IC chip and a holder therefor from which an end effector of the present invention is intended to automatically remove the chip, FIG. 2 is a side view of a lower portion of an end effector embodying the present invention, FIG. 3 is a front view of the end effector shown in FIG. 2, FIG. 4 is a bottom view of the end effector shown in FIGS. 2 and 3, and FIG. 5 is a schematic drawing showing a mechanism for controlling the motion of the gripper shown in FIGS. 2, 3 and 4.

DETAILED DESCRIPTION OF THE INVENTION

An end effector embodying the present invention for achieving the above and other objects is described below by way of FIGS. 2, 3 and 4. A generally U-shaped bracket 21 is affixed to the bottom of a housing structure 22 with its two legs extending downward. Two locating pins 25 are attached to the bottom surface of the two legs of the bracket 21, protruding further downward therefrom. These locating pins 25 are for positioning the end effector correcting with respect to the IC chip to be removed from its holder and intended therefore to be accurately inserted into matching holes (shown at 18 in FIG. 1) provided in the IC holder. In other words, these two locating pins 25 are not only individually shaped matchingly with respect to these holes 18 but also mutually separated by the same distance thereas.

A pair of grippers 27 shaped like pincers protrudes from the housing structure 22 and bends downward. By means of a mechanism disposed inside the housing structure 22 and to be explained below, these grippers 27 can be moved horizontally together out of and into the housing structure 22 as shown by doubleheaded arrows in FIGS. 3 and 4. A total of four shoving pins 28 are attached to the bottom surfaces of the grippers (two on each). As best shown in FIG. 2, the bottom surfaces of the grippers 27 are substantially coplanar with that of the aforementioned bracket 21 and both the two locating pins 25 and the four shoving pins 28 protrude downward respectively therefrom by approximately the same distance. The shoving pins 28 are provided for the purpose of shoving the tongue-like holding pieces 15 of the IC holder from their normal IC-supporting positions after the end effector is properly positioned with respect to the IC holder with the locating pins 25 properly inserted in the matching holes 18. Thus, the two of these shoving pins 28 on each gripper 27 are separated so as to be insertable through the IC holder as shown by broken lines in FIG. 1 and to shove the tongue-like holding pieces 15 outwardly away from the chip 11 carried at the center.

A vertically elongated tubular member 30 penetrates the housing structure 22 and is supported by another mechanism which is disposed inside the housing structure 22 and serves to move this tubular member 30 vertically up and down. The top end 31 of the tubular member 30 is adapted to be connected to a vacuum pump (not shown) and its open bottom end 32 is shaped like a funnel provided with a planar rim such that an airtight contact can be made with the IC chip 11.

The aforementioned mechanism for horizontally moving the grippers 27 includes a rotary actuator (not shown), a pinion 35 connected thereto and a pair of mutually parallel rack gears 36 as shown in FIG. 5 each securely affixed to one of the grippers 27. Both rack gears 36 engage with the pinion 35 from opposite directions such that they move together in opposite directions.

In FIG. 2, numeral 40 indicates another rotary actuator for controlling the vertical motion of the tubular member 30 and numeral 41 indicates another pinion which is connected thereto. Another race gear (not shown) is affixed longitudinally to the tubular member 30 and engages with the pinion 41 such that the tubular member 30 can be moved vertically up and down similarly by the operation of the actuator 40.

To use an end effector thus structured to remove an IC chip 11 from its holder in which it is supported as shown in FIG. 1, the top end 31 of the tubular member 30 is connected to a vacuum pump (not shown) and the end effector is maneuvered such that the locating pins 25 which are securely affixed to the housing structure 22 through the bracket 21 are properly inserted into the holes 18 of the IC holder. The grippers 27 and the vertical position of the tubular member 30 are initially so adjusted that the shoving pins 28 will automatically penetrate the IC holder at positions indicated in FIG. 1 and the bottom opening 32 of the tubular member 30 will make an air-tight contact with the upper surface of the IC chip 11 as the locating pins 25 are inserted into the matching holes 18. This causes the IC chip 11 to be pulled up by the operation of the aforementioned vacuum pump. Thus, if the rotary actuators are thereafter activated such that the grippers 27 are moved away from each other, thereby bending the tongue-like holding pieces 15 to release the chip 11, and the tubular member 30 is moved upward, the chip 11 is removed from the holder and lifted up, remaining attached to the bottom opening 32 of the tubular member 30.

The foregoing description of a preferred embodiment of the present invention has been presented for purposes of illustration and description. In FIGS. 2 and 3, a vacuum pump which connects to the tubular member 30, air pressure adjusting valves, a vacuum sensor and the like for providing suction through the tube 30 as well as a housing for these components are not included for the convenience of overall illustration. The description given above is not intended to be exhaustive or to limit the invention to the precise form disclosed, and any modifications that may be apparent to a person skilled in the art are intended to be included within the scope of this invention.

What is claimed is:

1. An end effector for automatically removing an IC chip from a frame-like holder therefor provided with holes at specified positions and a plurality of tongue-like protruding pieces extending in specified parallel direction and normally in contact with said IC chip to together securely support said IC chip with respect to said holder but elastically bendable away from said IC chip, said end effector comprising downward protruding locating pins which fit said holes to thereby correctly position said end effector with respect to said holder, a pair of pincer-like grippers, a plurality of downward shoving pins protruding downwardly from said grippers so as to be able, when said locating pins are inserted into said holes, to press and thereby bend said tongue-like protruding pieces to release said IC chip from said tongue-like protruding pieces, a tubular member disposed substantially vertically, a lower end thereof being directly above said IC chip when said locating pins are inserted into said holes, and an upper end thereof being connectable to vacuum pump means for providing suction at said lower end, gripper moving means for moving said grippers horizontally and linearly towards or away from each other, and tube moving means for vertically moving said tubular member up and down.

2. The end effector of claim 1 wherein said gripper moving means include a pinion connected to an actuator means, and a pair of mutually parallel rack gears engaging said pinion, said rack gears being individually secured to said grippers.

* * * * *